United States Patent [19]

Hiratsuka et al.

[11] Patent Number: 5,485,861
[45] Date of Patent: Jan. 23, 1996

[54] CLEANING TANK

[75] Inventors: Yutaka Hiratsuka; Tadashi Akiyama, both of Yokohama, Japan

[73] Assignee: Dan Science Co., Ltd., Tokyo, Japan

[21] Appl. No.: 317,351

[22] Filed: Oct. 4, 1994

[30] Foreign Application Priority Data

Oct. 19, 1993 [JP] Japan .................................. 5-260505

[51] Int. Cl.⁶ ...................................................... B08B 11/00
[52] U.S. Cl. .......................... 134/182; 134/186; 134/902
[58] Field of Search ............................ 134/50, 182, 186, 134/902, 155, 201, 183

[56] References Cited

U.S. PATENT DOCUMENTS

| | | | |
|---|---|---|---|
| 4,092,176 | 5/1978 | Kozai et al. | 134/902 |
| 4,305,413 | 12/1981 | Dougherty | 134/902 |
| 4,361,163 | 11/1982 | Aigo | 134/902 |
| 4,753,258 | 6/1988 | Seiichiro | 134/902 |
| 5,069,235 | 12/1991 | Vetter et al. | 134/902 |

FOREIGN PATENT DOCUMENTS

| | | | |
|---|---|---|---|
| 4-12824 | 4/1952 | Japan | 134/902 |
| 3-222420 | 10/1991 | Japan | 134/902 |
| 4-43639 | 2/1992 | Japan | 134/902 |
| 4-37131 | 2/1992 | Japan | 134/902 |

*Primary Examiner*—Frankie L. Stinson

[57] ABSTRACT

A cleaning tank defining therein a cleaning chamber adapted to receive an article to be cleaned and having an upper opening for carrying the article into and out of the cleaning chamber, a plurality of small holes provided in the bottom wall of the cleaning chamber and communicated with an outlet port, and at least one inlet port for introducing a cleaning liquid into the cleaning tank and into the cleaning chamber only through the upper opening thereof.

14 Claims, 2 Drawing Sheets

CLEANING TANK

BACKGROUND OF THE INVENTION

This invention relates to a cleaning tank and, particularly, to a construction of a cleaning tank utilized for cleaning a wafer and the like in producing a semi-conductor device, but the invention is not limited thereto. Various types of cleaning tanks have been utilized for cleaning a wafer and the like in producing a semi-conductor device. However, such prior art cleaning tanks cannot attain uniform flow of cleaning liquid in the cleaning tank and, reverse flow or turbulent flow has been observed in the cleaning tank. Thus, the cleaning liquid passed through the article to be cleaned and contaminated or bearing the substance removed from the surface of the article to be cleaned may mix with the fresh cleaning liquid, which decrease the cleaning efficiency substantially. Therefore, it has highly been required to provide a cleaning tank which can attain uniform liquid flow through every location in the cleaning tank.

An object of the present invention is to provide a novel cleaning tank having excellent cleaning characteristics.

SUMMARY OF THE INVENTION

According to the invention, there is provided a cleaning tank defining therein a cleaning chamber having a width, a length and a height adapted to receive an article to be cleaned and having an upper opening for carrying the article into and out of the cleaning chamber, a plurality of small holes provided in the bottom wall of the cleaning chamber, an outlet port communicated with the small holes in the bottom wall of the cleaning chamber, and at least one inlet port for introducing a cleaning liquid into the cleaning tank and uniformly to the upper opening of the cleaning chamber.

Preferably, the cleaning chamber is provided at the central portion of the cleaning tank in the plan view so that the cleaning liquid introduced into the cleaning tank flows into the cleaning chamber through the entire periphery of the cleaning chamber.

BRIEF DESCRIPTION OF THE DRAWINGS

The invention will be better understood with reference to the description which follows and the attached drawings, which are given by way of non-limiting example of preferred embodiments, wherein.

PREFERRED EMBODIMENTS OF THE INVENTION

Figure 3:
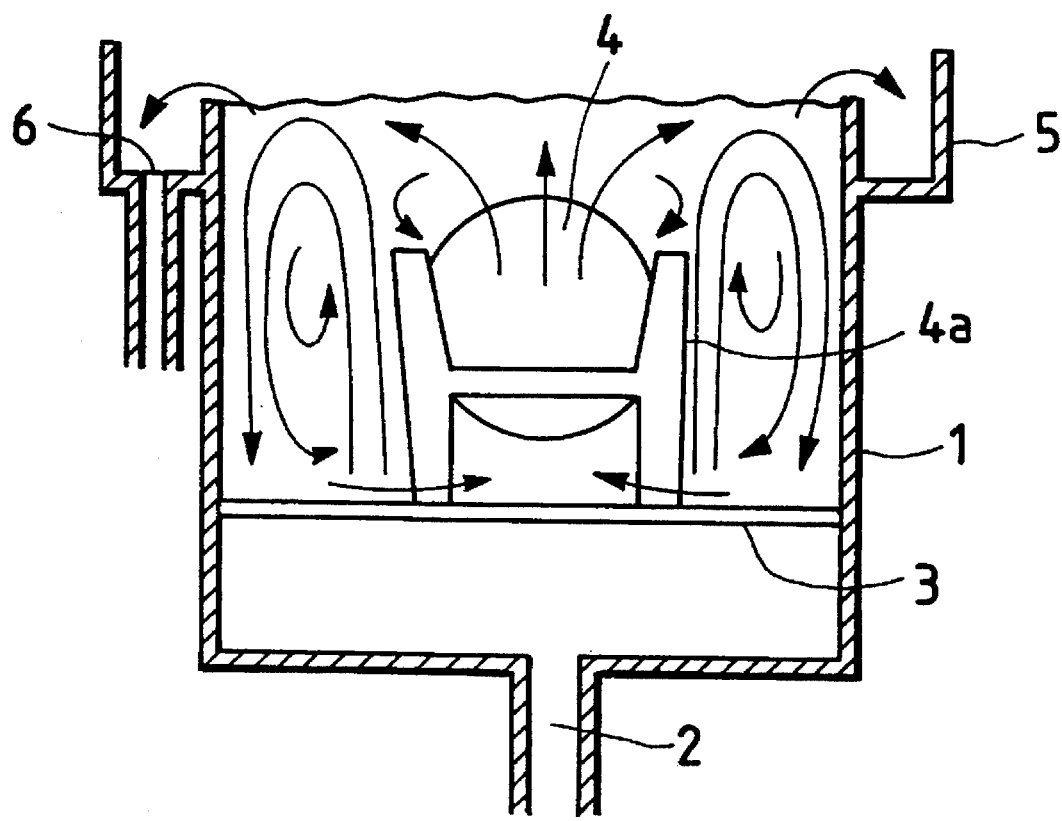
FIG. 3 is a schematic sectional view showing a prior art cleaning tank.

FIG. 3 shows a typical prior art cleaning tank utilized for cleaning a wafer and the like in producing a semi-conductor device. As shown in FIG. 3, a cleaning tank 1 is provided with an inlet port 2 in the bottom portion of the tank 1. A cleaning liquid introduced into the tank 1 through the inlet port 2 flows upward in the tank 1 and around an article 4 to be cleaned and, thereafter, overflows into a groove 5 provided around the upper edge of the tank 1, and is discharged outward through an outlet port 6. The article 4 shown in the drawing is a plurality of circular disc-shaped wafers being arranged in spaced parallel relationship and supported on a cassette 4a. The cassette 4a is preferably formed of a synthetic resin material, and is adapted to be transferred into or out of the tank 1 by an automatic transporting device not shown in the drawing. Incidentally, the cleaning liquid discharged from the outlet port 6 is cleaned by a suitable device such as a filter and the like not shown in the drawing and, thereafter, re-circulated into the tank 1.

In the prior aft device shown in FIG. 3, the cleaning liquid flowing upward from the inlet port 2 receives a relatively large resistance in passing through the article 4, but receives a relatively small resistance in the zone around the article 4, thus, there are formed zones of relatively high speed and of relatively low speed in the tank 1. Accordingly, there are formed turbulent flow in the cleaning tank which impedes uniform liquid flow in the cleaning tank and contaminated liquid will remain in the cleaning tank thereby decreasing the cleaning characteristics.

Figure 1:
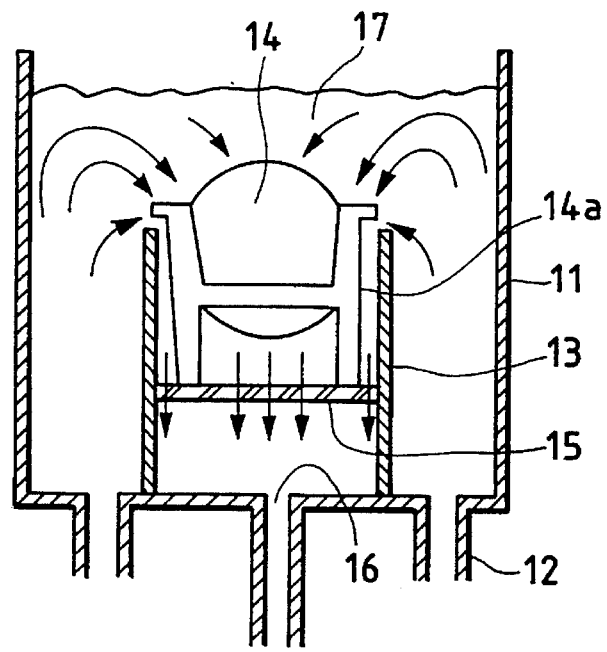
FIG. 1 is a schematic sectional view showing a preferred embodiment of the present invention.

FIG. 1 shows a schematic sectional view of a cleaning tank according to a first embodiment of the invention, in which, shown at numeral 11 is a cleaning tank defining therein a cleaning chamber 13. The cleaning chamber 13 has a predetermined width, a predetermined length and a predetermined height which are adapted to receive an article 14 to be cleaned and having an upper opening for carrying the article into and out of the cleaning chamber 13. In FIG. 1, the article 14 to be cleaned is a plurality of generally disc shaped thin wafers which are arranged in spaced parallel relationship and are supported on a cassette 14a.

In a bottom wall 15 of the cleaning chamber 13, there are provided a plurality of small holes for smoothly guide the cleaning liquid 17 out of the cleaning chamber 13 through one or more outlet ports 16.

The cleaning liquid is introduced into the cleaning tank 11 through inlet ports 12 which are provided in the bottom wall of the tank 1t and outside of the cleaning chamber 13. Preferably, the cleaning chamber 13 is located in the central portion of the tank 11 in plan view to define liquid introducing chambers around the entire circumference of the cleaning chamber 13, so that the cleaning liquid flows evenly into the cleaning chamber 13. However, such liquid introducing chambers may be provided only in widthwise opposite portions.

As shown in the drawing, the upper end of the article 14 to be cleaned projects upward from the upper end of the cleaning chamber 18 and, in such case, the flow rate of the cleaning liquid supplied into the cleaning tank 11 is determined to be sufficiently large so that the free surface of the cleaning liquid in the tank 11 is sufficiently higher than the upper end of the article 14, which ensures uniform liquid flow passing through the article 14.

Preferably, the distance between the upper edge of the article 14 and the free surface of the liquid in the tank 11 is determined to be not less than 30 mm.

The cleaning liquid passing through the article 14 acts to remove contaminating particles and the like attached on the surface of the article 14 and, the cleaning characteristics are determined mainly by the flow velocity of the cleaning liquid passing through the article 14, when the type of the cleaning liquid, the type of the contamination, the arrangement and the size of the cleaning tank and the like are given, then, the flow velocity of the cleaning liquid is determined to attain the best cleaning characteristics by controlling the valves (not shown in the drawing) provided in liquid supplying or exhausting pipelines in liquid circulating system (not shown also in the drawing).

The flow uniformity can be changed by changing the number and the size of the small holes in the bottom wall 15 of the cleaning chamber 13 however, such conditions have to be decided by experimental real flow.

In the cleaning chamber 13, there is a relatively small space between the wall of the chamber 13 and the articles 14 to be cleaned and between respective articles 14, thus, the liquid passing through the chamber 13 does not cause circulating flow in the chamber 13 and the contaminating substance dislodged from the articles 14 is reliably expelled out of the chamber 13 and good cleaning characteristics can be obtained. Further, the size of the tank 1 is preferably as small as possible. And for preventing turbulent flow in the tank the space between the inner surface of the tank and the outer surface of the cleaning chamber 13 is determined as small as possible, but for attaining uniform flow of the liquid introduced into the tank 1 the space is determined at least 10 mm.

Figure 2:
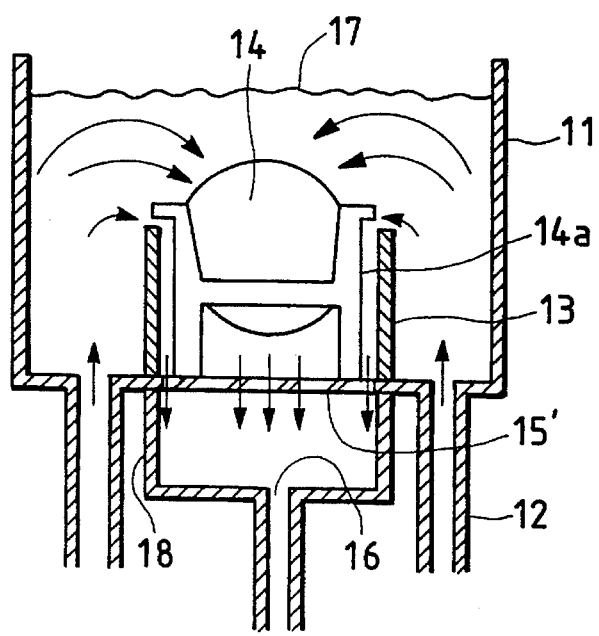
FIG. 2 is a schematic sectional view showing a modified form of the present invention.

FIG. 2 shows a modified form which differs from FIG. 1 in that a chamber 18 for collecting the liquid passed through the small holes in the bottom wall 15 is provided below of the main body of the cleaning tank 11. The construction is generally similar to the first embodiment, but the amount of the liquid received in the cleaning tank 11 can be reduced.

According to tile invention, it is possible to assure uniform liquid down-flow across the article to be cleaned, and to assure the contaminated liquid is not re-circulating in the cleaning tank, thus, the cleaning characteristics can be improved substantially.

The invention is not limited to the embodiments, and various changes and modifications can easily be made by those skilled in the art.

What is claimed is:

1. A cleaning tank defining therein a cleaning chamber having a width, a length and a height adapted to receive an article to be cleaned and having an upper opening for carrying the article into and out of the cleaning chamber, a plurality of small holes provided in a bottom wall of the cleaning chamber, an outlet port communicated with the small holes, and at least one inlet port provided in the bottom portion of the cleaning tank and outside of the cleaning chamber for introducing a cleaning liquid into the cleaning tank and to the upper opening of the cleaning chamber.

2. A cleaning tank according to claim 1, in which the cleaning chamber is provided at the central portion of the cleaning tank so that the cleaning liquid introduced into the cleaning tank flows downward and uniformly into the cleaning chamber.

3. A cleaning tank according to claim 2, in which the flow velocity of the cleaning liquid supplied into the cleaning tank is determined such that the free surface of the cleaning liquid in the cleaning tank is not less than 30 mm above the top portion of the article to be cleaned.

4. A cleaning tank according to claim 1, in which the cleaning chamber has an elongated form.

5. A cleaning tank according to claim 4, in which the flow velocity of the cleaning liquid supplied into the cleaning tank is determined such that the free surface of the cleaning liquid in the cleaning tank is not less than 30 mm above the top portion of the article to be cleaned.

6. A cleaning tank according to claim 1, in which the flow velocity of the cleaning liquid supplied into the cleaning tank is determined such that the free surface of the cleaning liquid in the cleaning tank is not less than 30 mm above the top portion of the article to be cleaned.

7. A cleaning tank for cleaning an article, said cleaning tank comprising:

an outer tank having a bottom wall and a plurality of side walls, said outer tank including at least one inlet port for introducing a cleaning fluid into the outer tank;

a cleaning chamber located within said outer tank, said cleaning chamber including:

a bottom wall having a plurality of apertures therein, said apertures being in fluid communication with an outlet port;

a plurality of side walls having upper edges; and an opening in an upper portion of said cleaning chamber for receiving said article therethrough;

wherein said cleaning fluid is introduced into said outer tank through said inlet port, flows over the upper edges and into the opening in the cleaning chamber, and is released from the cleaning chamber through the plurality of apertures and the outlet port.

8. The cleaning tank according to claim 7, wherein said inlet port is located in the bottom wall of said outer tank.

9. The cleaning tank according to claim 8, wherein said outlet port is located in the bottom wall of said outer tank.

10. The cleaning tank according to claim 9, wherein the bottom wall of the cleaning chamber is elevated with respect to the bottom wall of the outer tank.

11. The cleaning tank according to claim 7, wherein said outlet port is located in the bottom wall of said outer tank.

12. The cleaning tank according to claim 7, wherein the bottom wall of the cleaning chamber is elevated with respect to the bottom wall of the outer tank.

13. The cleaning tank according to claim 7, wherein the bottom wall of the cleaning chamber is located at approximately a same elevational level as the bottom wall of the outer tank.

14. The cleaning tank according to claim 7, wherein the cleaning chamber is located centrally between the side walls of the outer tank.

* * * * *